(12) United States Patent
Kuwajima et al.

(10) Patent No.: US 7,649,251 B2
(45) Date of Patent: Jan. 19, 2010

(54) THIN-FILM DEVICE

(75) Inventors: Hajime Kuwajima, Tokyo (JP); Masahiro Itoh, Tokyo (JP); Masahiro Miyazaki, Tokyo (JP); Akira Furuya, Tokyo (JP)

(73) Assignee: TDK Corporation, Tokyo (JP)

( * ) Notice: Subject to any disclaimer, the term of this patent is extended or adjusted under 35 U.S.C. 154(b) by 341 days.

(21) Appl. No.: 11/701,361

(22) Filed: Feb. 2, 2007

(65) Prior Publication Data
US 2007/0194345 A1 Aug. 23, 2007

(30) Foreign Application Priority Data
Feb. 17, 2006 (JP) ............................... 2006-041226

(51) Int. Cl.
*H01L 23/48* (2006.01)
(52) U.S. Cl. ...................... 257/693; 257/684; 257/697; 257/701; 257/E23.169
(58) Field of Classification Search ................ 257/684, 257/701, 780, 693, 697
See application file for complete search history.

(56) References Cited
U.S. PATENT DOCUMENTS 5,994,774 A * 11/1999 Siegel et al. ................ 257/727
6,268,642 B1 * 7/2001 Hsuan et al. ................ 257/620
6,276,995 B1    8/2001 Matsuta et al.
6,583,515 B1 * 6/2003 James et al. ................ 257/779
2003/0230805 A1 12/2003 Noma et al.
2005/0116310 A1  6/2005 Nishi et al.

FOREIGN PATENT DOCUMENTS

| CN | 1453865 A | 11/2003 |
|---|---|---|
| CN | 1606174 A | 4/2005 |
| JP | A 10-163002 | 6/1998 |
| JP | A 11-3833 | 1/1999 |

* cited by examiner

*Primary Examiner*—Wai-Sing Louie
(74) *Attorney, Agent, or Firm*—Oliff & Berridge, PLC

(57) ABSTRACT

A thin-film device incorporates: a substrate; an insulating layer, a plurality of lower conductor layers, a dielectric film, an insulating layer, a plurality of upper conductor layers and a protection film that are stacked in this order on the substrate; and a plurality of terminal electrodes. One of the terminal electrodes is connected to one of the lower conductor layers. The one of the lower conductor layers has a protruding portion that protrudes to extend more outward in a lateral direction than a side surface of the insulating layer. The one of the terminal electrodes has a concave portion that accommodates and touches at least part of the protruding portion, and touches the side surface of the insulating layer.

5 Claims, 9 Drawing Sheets

THIN-FILM DEVICE

BACKGROUND OF THE INVENTION

1. Field of the Invention

The present invention relates to a thin-film device incorporating a conductor layer and a terminal electrode connected to the conductor layer.

2. Description of the Related Art

With increasing demands for reductions in dimensions and thickness of high frequency electronic apparatuses such as cellular phones, reductions in dimensions and profile of electronic components mounted on the high frequency electronic apparatuses have been sought. Some of the electronic components have such a configuration that insulating layers and conductor layers are formed on a substrate through the use of thin-film forming techniques. Such electronic components formed through the use of thin-film forming techniques are called thin-film device in the present patent application.

In a thin-film device, terminal electrodes are provided for connecting conductor layers to an external circuit. Here, a portion of the thin-film device other than the terminal electrodes is called a device main body. Each conductor layer connected to the terminal electrodes includes a wiring portion, for example, and is formed so that an end face of the wiring portion is exposed at a side surface of the device main body. In this case, the terminal electrodes are disposed on the side surfaces of the device main body, for example, so as to be connected to the end faces of the wiring portion.

Here is given an example of a method of manufacturing a thin-film device wherein the terminal electrodes are disposed on the side surfaces of the device main body. In the method, first, a thin-film device substructure is fabricated by forming layers such as conductor layers corresponding to a plurality of thin-film devices on a single wafer (a substrate). The substructure includes a plurality of preliminary device main body portions each of which will be a device main body. Furthermore, in the substructure, there are provided portions to be removed between respective adjacent ones of the preliminary device main body portions. Next, the plurality of preliminary device main body portions are divided into a plurality of device main bodies by cutting the substructure at positions of the portions to be removed. By cutting the substructure in such a manner, side surfaces of the device main bodies are formed, and end faces of wiring portions to be connected to terminal electrodes are exposed at the side surfaces. Next, the terminal electrodes are formed on the side surfaces of the device main bodies.

To reduce the dimensions and profile of a thin-film device, it is effective to reduce the thickness of layers such as conductor layers. However, according to the above-described method, a reduction in thickness of conductor layers causes a reduction in area of the end faces of the wiring portion connected to the terminal electrodes. As a result, the regions in which the conductor layers touch the terminal electrodes are reduced in area, and accordingly it becomes difficult to secure the reliability of connection between the conductor layers and the terminal electrodes.

To avoid this problem, such a technique is conceivable that the wiring portion may be increased in width to thereby increase the area of the end faces of the wiring portion. However, this may cause a problem in the thin-film device that the density of the wiring portion is reduced and therefore it becomes difficult to reduce the dimensions of the thin-film device, or that the impedance of the wiring portion deviates from a desired value and the characteristics of the thin-film device are thereby degraded.

JP 10-163002A discloses a technique wherein, in a chip-shaped electronic component in which an inner conductor film is disposed on a substrate and external terminal electrodes are connected to the end faces of the inner conductor film, the end faces of the inner conductor film are tilted with respect to a sectional surface of the substrate.

JP 11-003833A discloses a technique wherein, in an electronic component in which electrodes are disposed on a substrate and external terminals are connected to the end faces of the electrodes, the end faces of the electrodes on the substrate are tilted with respect to a sectional surface of the substrate.

In the following description, the external terminal electrodes of JP 10-163002A and the external terminals of JP 11-003833A are both called terminal electrodes.

As previously described, in a thin-film device in which terminal electrodes are disposed on the side surfaces of the device main body, a reduction in thickness of conductor layers causes a reduction in area of the end faces of the wiring portion connected to the terminal electrodes, and as a result, the regions in which the conductor layers touch the terminal electrodes are reduced in area and accordingly it becomes difficult to secure the reliability of connection between the conductor layers and the terminal electrodes.

According to the technique disclosed in JP 10-163002A or JP 11-003833A, it is possible to increase the area of the regions in which the conductor layers touch the terminal electrodes, but the amount of increase in the area is very small. It is therefore difficult to secure a satisfactory degree of reliability of connection between the conductor layers and the terminal electrodes through the use of the techniques disclosed in these publications.

OBJECT AND SUMMARY OF THE INVENTION

It is an object of the invention to provide a thin-film device incorporating a conductor layer and a terminal electrode connected to the conductor layer, the thin-film device being capable of enhancing the reliability of connection between the conductor layer and the terminal electrode.

A thin-film device of the invention incorporates an underlying layer, a conductor layer and a terminal electrode. The underlying layer has a bottom surface and a top surface that face toward opposite directions, and a side surface that couple the bottom surface and the top surface to each other. The conductor layer is disposed on the top surface of the underlying layer. The terminal electrode is connected to the conductor layer. The conductor layer has a protruding portion that protrudes to extend more outward in a lateral direction than the side surface of the underlying layer. The terminal electrode has a concave portion that accommodates and touches at least part of the protruding portion, and the terminal electrode touches the side surface of the underlying layer.

According to the thin-film device of the invention, the concave portion of the terminal electrode touches the protruding portion of the conductor layer, and the terminal electrode is thereby connected to the conductor layer.

In the thin-film device of the invention, the underlying layer may be made of an insulating material.

The thin-film device of the invention may further incorporate a coating layer having a bottom surface and a top surface that face toward opposite directions, and a side surface that couple the bottom surface and the top surface to each other. At least a portion of the conductor layer other than the protruding portion may be disposed between the top surface of the underlying layer and the bottom surface of the coating layer, and the protruding portion may protrude to extend more outward in a lateral direction than the side surface of the underlying layer and the side surface of the coating layer. In addition, the terminal electrode may further touch the side surface of the coating layer. The coating layer may be made of an insulating material.

In the thin-film device of the invention, when the protruding portion is sectioned with an imaginary plane intersecting the top surface of the underlying layer at a right angle, at least part of the contour of a cross section of the protruding section may form a convex-shaped curved line.

In the thin-film device of the invention, the maximum thickness of the protruding portion may be greater than the thickness of any portion of the conductor layer other than the protruding portion.

According to the thin-film device of the invention, the concave portion of the terminal electrode touches the protruding portion of the conductor layer, so that the terminal electrode is connected to the conductor layer. As a result, according to the invention, it is possible to increase the area of the region in which the conductor layer touches the terminal electrode and to thereby enhance the reliability of connection between the conductor layer and the terminal electrode.

Other and further objects, features and advantages of the invention will appear more fully from the following description.

DESCRIPTION OF PREFERRED EMBODIMENTS

First Embodiment

Figure 6:
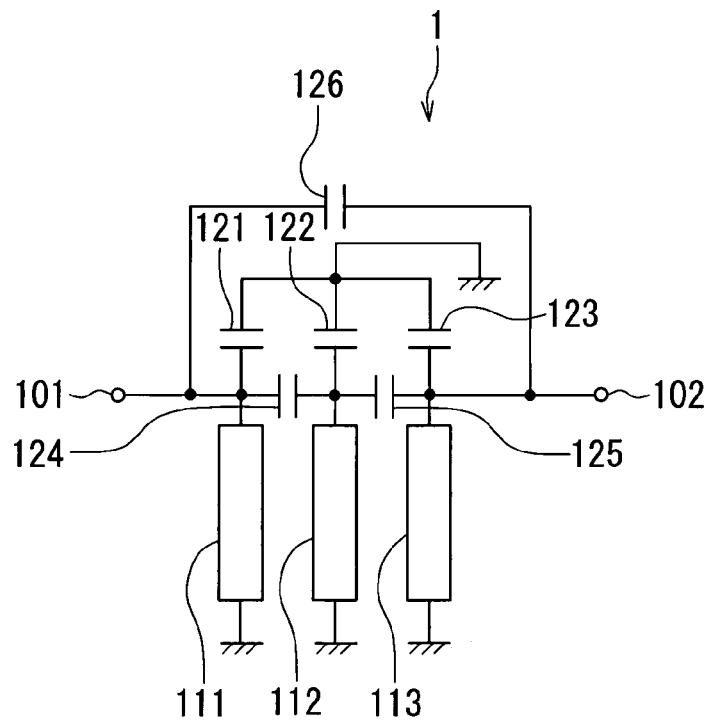
FIG. 6 is a schematic diagram illustrating the circuit configuration of the thin-film device of the first embodiment of the invention.

Preferred embodiments of the invention will now be described in detail with reference to the accompanying drawings. Reference is now made to FIG. 6 to describe the circuit configuration of a thin-film device of a first embodiment of the invention. FIG. 6 is a schematic diagram illustrating the circuit configuration of the thin-film device of the first embodiment.

As shown in FIG. 6, the thin-film device 1 of the embodiment incorporates: two input/output terminals 101 and 102 for receiving and outputting signals; and three inductors 111, 112 and 113.

The thin-film device 1 further incorporates: a capacitor 121 provided between one of ends of the inductor 111 and the ground; a capacitor 122 provided between one of ends of the inductor 112 and the ground; a capacitor 123 provided between one of ends of the inductor 113 and the ground; a capacitor 124 provided between the one of the ends of the inductor 111 and the one of the ends of the inductor 112; a capacitor 125 provided between the one of the ends of the inductor 112 and the one of the ends of the inductor 113; and a capacitor 126 provided between the one of the ends of the inductor 111 and the one of the ends of the inductor 113.

The input/output terminal 101 is connected to the one of the ends of the inductor 111. The input/output terminal 102 is connected to the one of the ends of the inductor 113. The other of the ends of each of the inductors 111, 112 and 113 is connected to the ground.

The operation of the thin-film device 1 of the embodiment will now be described. The thin-film device 1 of the embodiment has a function of a band-pass filter. If signals are inputted to the input/output terminal 101 of the thin-film device 1, signals at frequencies within a specific frequency band among these signals are selectively outputted from the input/output terminal 102. On the contrary, if signals are inputted to the input/output terminal 102, signals at frequencies within a specific frequency band among these signals are selectively outputted from the input/output terminal 101.

Figure 1:
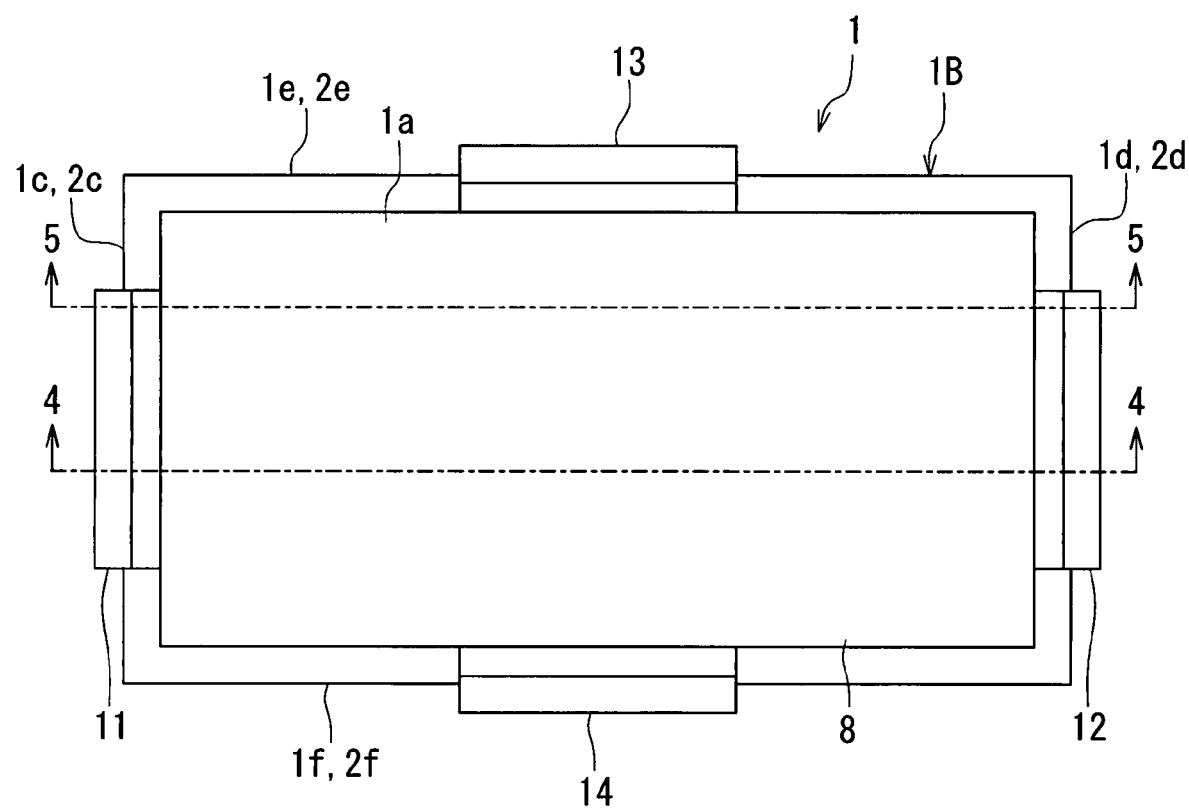
FIG. 1 is a top view of a thin-film device of a first embodiment of the invention.
Figure 2:
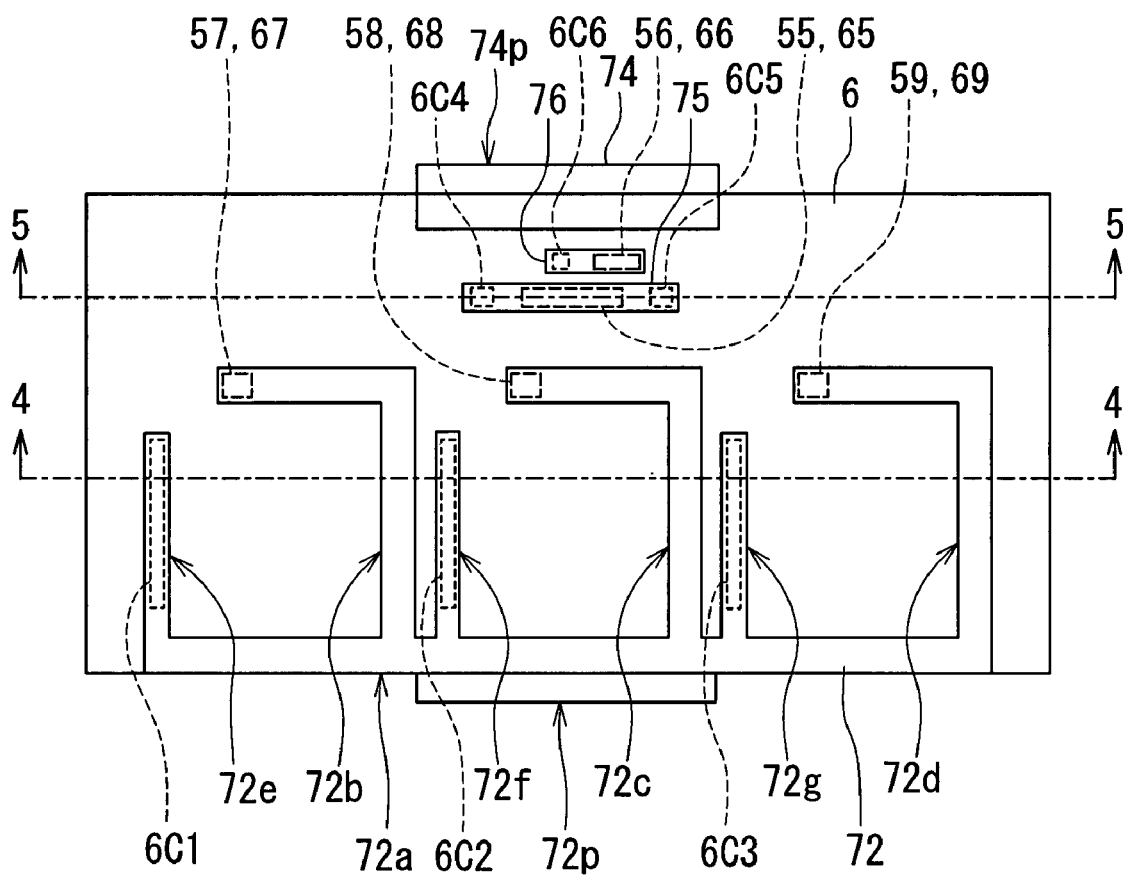
FIG. 2 is a top view of upper conductor layers that the thin-film device of the first embodiment of the invention includes.
Figure 3:
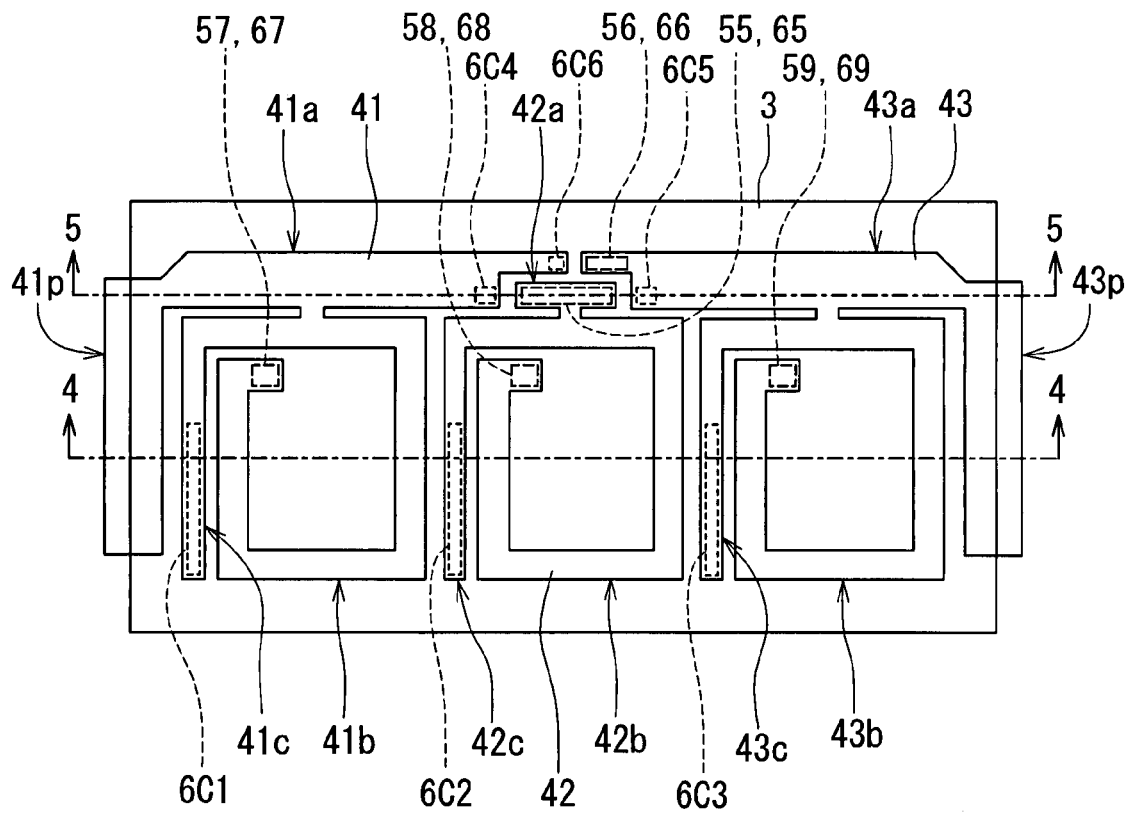
FIG. 3 is a top view of lower conductor layers that the thin-film device of the first embodiment of the invention includes.
Figure 4:
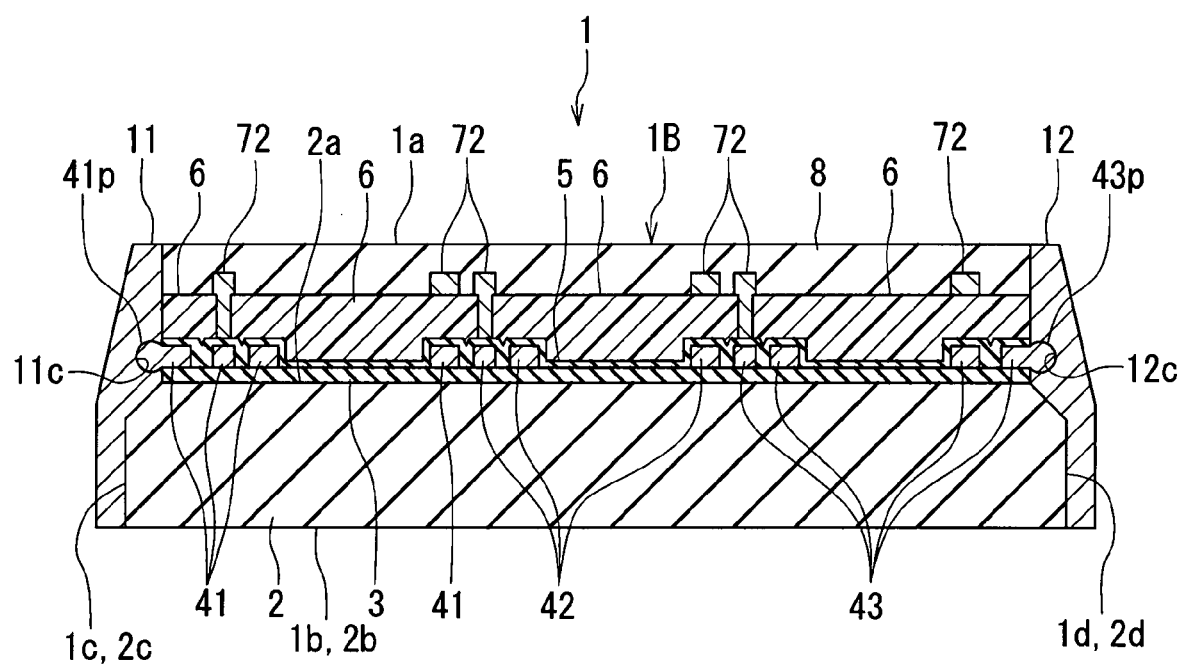
FIG. 4 is a cross-sectional view of the thin-film device taken along line 4-4 of FIG. 1 to FIG. 3.
Figure 5:
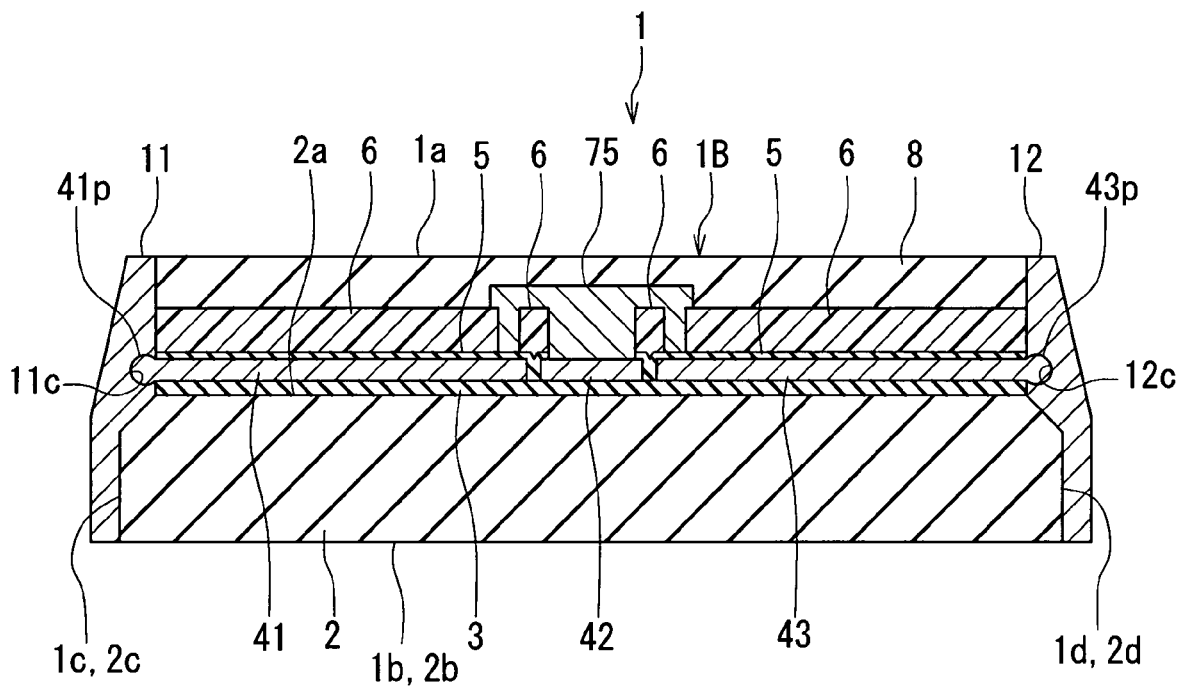
FIG. 5 is a cross-sectional view of the thin-film device taken along line 5-5 of FIG. 1 to FIG. 3.

Reference is now made to FIG. 1 to FIG. 5 to describe the structure of the thin-film device 1 of the embodiment. FIG. 1 is a top view of the thin-film device 1. FIG. 2 is a top view of upper conductor layers that the thin-film device 1 includes. FIG. 3 is a top view of lower conductor layers that the thin-film device 1 includes. Each of FIG. 4 and FIG. 5 is a cross-sectional view of the thin-film device 1. FIG. 4 illustrates a cross section taken along line 4-4 of FIG. 1 to FIG. 3. FIG. 5 illustrates a cross section taken along line 5-5 of FIG. 1 to FIG. 3.

As shown in FIG. 4 and FIG. 5, the thin-film device 1 incorporates a substrate 2 and an insulating layer 3 disposed on the substrate 2. As shown in FIG. 3, the thin-film device 1 further incorporates lower conductor layers 41 to 43 disposed on the insulating layer 3.

As shown in FIG. 4 and FIG. 5, the thin-film device 1 further incorporates: a dielectric film 5 disposed to cover major portions of the insulating layer 3 and the lower conductor layers 41 to 43; and an insulating layer 6 disposed on the dielectric film 5. As shown in FIG. 2, the thin-film device 1 further incorporates upper conductor layers 72 and 74 to 76, major portions of which are disposed on the insulating layer 6.

As shown in FIG. 4 and FIG. 5, the thin-film device 1 further incorporates a protection film 8 disposed to cover major portions of the insulating layer 6 and the upper conductor layers 72 and 74 to 76. As shown in FIG. 1, the thin-film device 1 further incorporates four terminal electrodes 11 to 14. The terminal electrode 11 forms the input/output terminal 101 of FIG. 6. The terminal electrode 12 forms the input/output terminal 102 of FIG. 6. The terminal electrodes 13 and 14 are adapted to be connected to the ground.

Here, a portion of the thin-film device 1 other than the terminal electrodes 11 to 14 is called a device main body 1B. The device main body 1B is nearly rectangular-solid-shaped, and has a top surface (a top surface of the protection film 8) 1a, a bottom surface (a bottom surface of the substrate 2) 1b, and four side surfaces 1c to 1f coupling the top surface 1a and the bottom surface 1b to each other. The terminal electrodes 11 to 14 are disposed to touch respective portions of the side surfaces 1c to 1f.

The substrate 2 is made of an insulating material (a dielectric material), for example. The insulating material forming the substrate 2 may be an inorganic material or an organic material. The insulating material forming the substrate 2 may be $Al_2O_3$, for example. The substrate 2 may be made of a semiconductor material.

The insulating layer 3 is made of an insulating material. The insulating material forming the insulating layer 3 may be an inorganic material or an organic material. The inorganic material forming the insulating layer 3 may be $Al_2O_3$, for example. The organic material forming the insulating layer 3 may be a resin. In this case, the resin may be a thermoplastic resin or a thermosetting resin. The surface roughness of the top surface of the insulating layer 3 is smaller than that of the top surface of the substrate 2. Therefore, the insulating layer 3 has a function of reducing the surface roughness of a layer underlying the lower conductor layers 41 to 43. It is required that the insulating layer 3 absorb irregularities of the top surface of the substrate 2 and that the top surface of the insulating layer 3 be flat. To achieve this, it is desirable that the insulating layer 3 have a thickness within a range of 0.1 to 10 μm inclusive. If the substrate 2 is made of an insulating material and the surface roughness of the top surface thereof is sufficiently small, the lower conductor layers 41 to 43 may be disposed directly on the substrate 2 without providing the insulating layer 3.

The lower conductor layers 41 to 43, the upper conductor layers 72 and 74 to 76, and the terminal electrodes 11 to 14 are made of a conductive material. Each of the lower conductor layers 41 to 43 preferably has a thickness within a range of 5 to 10 μm inclusive. Each of the upper conductor layers 72 and 74 to 76 preferably has a thickness within a range of 5 to 10 μm inclusive. Each of the terminal electrodes 11 to 14 preferably has a thickness within a range of 0.5 to 10 μm inclusive, so that breakage of the terminal electrodes 11 to 14 will not occur in corners or stepped portions.

The dielectric film 5 is made of a dielectric material (an insulating material). The dielectric material forming the dielectric film 5 is preferably an inorganic material. The dielectric material forming the dielectric film 5 may be $Al_2O_3$, $Si_4N_3$ or $SiO_2$, for example. The dielectric film 5 preferably has a thickness within a range of 0.02 to 1 μm inclusive, and more preferably within a range of 0.05 to 0.5 μm inclusive.

Each of the insulating layer 6 and the protection film 8 is made of an insulating material. The insulating material forming the insulating layer 6 and the protection film 8 may be an inorganic material or an organic material. The inorganic material forming the insulating layer 6 and the protection film 8 may be $Al_2O_3$, for example. The organic material forming the insulating layer 3 and the protection film 8 may be a resin.

In this case, the resin may be a thermoplastic resin or a thermosetting resin. The resin may be any of a polyimide resin, an acrylic resin, an epoxy resin, an ethylene tetrafluoride resin, denatured polyphenylene ether, a liquid crystal polymer, and modified polyimide, for example. The resin may be a photosensitive resin. The insulating layer 6 preferably has a thickness within a range of 0.1 to 10 μm inclusive, so as to improve the reliability of insulation between the upper and lower conductor layers and to improve the high frequency characteristic by suppressing occurrences of unwanted components such as stray capacitance. The protection film 8 preferably has a thickness within a range of 1 to 50 μm inclusive, so as to protect the inside of the product with the protection film 8.

The substrate 2 has: a first surface (top surface) 2a and a second surface (bottom surface) 2b that face toward opposite directions; and four side surfaces 2c to 2f that couple the first surface 2a and the second surface 2b to each other. The side surfaces 2c and 2d are shown in FIG. 4 and FIG. 5. However, the side surfaces 2e and 2f do not appear in FIG. 4 and FIG. 5. Therefore, the locations of the side surfaces 2c to 2f are shown in FIG. 1 for convenience.

In a portion of the substrate 2 located higher than a specific level between the first surface 2a and the second surface 2b, the area of a cross section parallel to the first surface 2a gradually decreases as the distance from the first surface 2a decreases. Furthermore, portions of the side surfaces 2c to 2f of the substrate 2 located higher than the above-mentioned level form sloped surfaces.

The insulating layer 3 has: bottom and top surfaces that face toward opposite directions; and side surfaces that couple the bottom and top surfaces to each other. The insulating layer 3 corresponds to the underlying layer of the invention when seen from the lower conductor layers 41 and 43. If the insulating layer 3 is not provided, the substrate 2 corresponds to the underlying layer of the invention when seen from the lower conductor layers 41 and 43.

The dielectric film 5 has: bottom and top surfaces that face toward opposite directions; and side surfaces that couple the bottom and top surfaces to each other. The dielectric film 5 corresponds to the coating layer of the invention when seen from the lower conductor layers 41 and 43.

The insulating layer 6 has: bottom and top surfaces that face toward opposite directions; and side surfaces that couple the bottom and top surfaces to each other. The insulating layer 6 corresponds to the underlying layer of the invention when seen from the upper conductor layers 74 and 72.

The protection film 8 has: bottom and top surfaces that face toward opposite directions; and side surfaces that couple the bottom and top surfaces to each other. The protection film 8 corresponds to the coating layer of the invention when seen from the upper conductor layers 74 and 72.

Reference is now made to FIG. 3 to describe the lower conductor layers 41 to 43 in detail. The lower conductor layer 41 has: a wiring portion 41a; and an inductor-forming portion 41b and a capacitor-forming portion 41c that are connected to the wiring portion 41a. The lower conductor layer 41 further has a protruding portion 41p connected to the wiring portion 41a. The protruding portion 41p protrudes to extend more outward in a lateral direction than the side surface of the dielectric film 5 and the side surface of the insulating layer 3 disposed at the side surface 1c of the device main body 1B. The lower conductor layer 42 has: a wiring portion 42a; and an inductor-forming portion 42b and a capacitor-forming portion 42c that are connected to the wiring portion 42a. The lower conductor layer 43 has: a wiring portion 43a; and an inductor-forming portion 43b and a capacitor-forming portion 43c that are connected to the wiring portion 43a. The lower conductor layer 43 further has a protruding portion 43p connected to the wiring portion 43a. The protruding portion 43p protrudes to extend more outward in a lateral direction than the side surface of the dielectric film 5 and the side surface of the insulating layer 3 disposed at the side surface 1d of the device main body 1B.

As shown in FIG. 4, when each of the protruding portions 41p and 43p is sectioned with an imaginary plane intersecting the top surface of the insulating layer 3 at a right angle, at least part of the contour of the cross section of each of the protruding portions 41p and 43p forms a convex-shaped curved line. The maximum thickness of each of the protruding portions 41p and 43p is greater than the thickness of any portion of the lower conductor layers 41 and 43 other than the protruding portions 41p and 43p.

Reference is now made to FIG. 2 to describe the upper conductor layers 72 and 74 to 76 in detail. The upper conductor layer 72 has: a wiring portion 72a; and three inductor-forming portions 72b, 72c and 72d and three capacitor-forming portions 72e, 72f and 72g that are connected to the wiring portion 72a. When the upper conductor layer 72 is seen from above, a portion of the inductor-forming portion 72b is located in a region that coincides with a portion of the inductor-forming portion 41b, a portion of the inductor-forming portion 72c is located in a region that coincides with a portion of the inductor-forming portion 42b, and a portion of the inductor-forming portion 72d is located in a region that coincides with a portion of the inductor-forming portion 43b. Furthermore, when the upper conductor layer 72 is seen from above, a portion of the capacitor-forming portion 72e is located in a region that coincides with a portion of the capacitor-forming portion 41c, a portion of the capacitor-forming portion 72f is located in a region that coincides with a portion of the capacitor-forming portion 42c, and a portion of the capacitor-forming portion 72g is located in a region that coincides with a portion of the capacitor-forming portion 43c. The upper conductor layer 72 further has a protruding portion 72p connected to the wiring portion 72a. The protruding portion 72p protrudes to extend more outward in a lateral direction than the side surface of the protection film 8 and the side surface of the insulating layer 6 disposed at the side surface 1f of the device main body 1B.

When the upper conductor layer 74 is seen from above, the upper conductor layer 74 is located near the edge between the first surface 2a and the side surface 2e of the substrate 2. The upper conductor layer 74 has a protruding portion 74p that protrudes to extend more outward in a lateral direction than the side surface of the protection film 8 and the side surface of the insulating layer 6 disposed at the side surface 1e of the device main body 1B.

When each of the protruding portions 74p and 72p is sectioned with an imaginary plane intersecting the top surface of the insulating layer 6 at a right angle, at least part of the contour of the cross section of each of the protruding portions 74p and 72p forms a convex-shaped curved line. The maximum thickness of each of the protruding portions 74p and 72p is greater than the thickness of any portion of the upper conductor layers 74 and 72 other than the protruding portions 74p and 72p.

When the upper conductor layer 75 is seen from above, the upper conductor layer 75 is located in a region that coincides with the wiring portion 42a and a portion of each of the wiring portions 41a and 43a. When the upper conductor layer 76 is seen from above, the upper conductor layer 76 is located in a region that coincides with another portion of each of the wiring portions 41a and 43a.

Reference is now made to FIG. 2 and FIG. 3 to describe a plurality of openings formed in each of the dielectric film 5 and the insulating layer 6. The locations of these openings are indicated with broken lines in FIG. 2 and FIG. 3. The dielectric film 5 has openings 55 to 59. The insulating layer 6 has openings 65 to 69 and openings 6C1 to 6C6. The openings 65 to 69 are contiguous to the openings 55 to 59, respectively.

The upper conductor layer 75 is connected to the wiring portion 42a of the lower conductor layer 42 via the openings 55 and 65. The upper conductor layer 76 is connected to the wiring portion 43a of the lower conductor layer 43 via the openings 56 and 66.

The inductor-forming portion 72b of the upper conductor layer 72 is connected to the inductor-forming portion 41b of the lower conductor layer 41 via the openings 57 and 67. The inductor-forming portions 72b and 41b form the inductor 111 of FIG. 6.

The inductor-forming portion 72c of the upper conductor layer 72 is connected to the inductor-forming portion 42b of the lower conductor layer 42 via the openings 58 and 68. The inductor-forming portions 72c and 42b form the inductor 112 of FIG. 6.

The inductor-forming portion 72d of the upper conductor layer 72 is connected to the inductor-forming portion 43b of the lower conductor layer 43 via the openings 59 and 69. The inductor-forming portions 72d and 43b form the inductor 113 of FIG. 6.

A portion of the capacitor-forming portion 72e of the upper conductor layer 72 is disposed in the opening 6C1 and opposed to a portion of the capacitor-forming portion 41c of the lower conductor layer 41 with the dielectric film 5 disposed in between. The dielectric film 5 and these portions of the capacitor-forming portions 72e and 41c form the capacitor 121 of FIG. 6.

A portion of the capacitor-forming portion 72f of the upper conductor layer 72 is disposed in the opening 6C2 and opposed to a portion of the capacitor-forming portion 42c of the lower conductor layer 42 with the dielectric film 5 disposed in between. The dielectric film 5 and these portions of the capacitor-forming portions 72f and 42c form the capacitor 122 of FIG. 6.

A portion of the capacitor-forming portion 72g of the upper conductor layer 72 is disposed in the opening 6C3 and opposed to a portion of the capacitor-forming portion 43c of the lower conductor layer 43 with the dielectric film 5 disposed in between. The dielectric film 5 and these portions of the capacitor-forming portions 72g and 43c form the capacitor 123 of FIG. 6.

A portion of the upper conductor layer 75 is disposed in the opening 6C4 and opposed to a portion of the wiring portion 41a of the lower conductor layer 41 with the dielectric film 5 disposed in between. The dielectric film 5 and these portions of the upper conductor layer 75 and the wiring portion 41a form the capacitor 124 of FIG. 6.

Another portion of the upper conductor layer 75 is disposed in the opening 6C5 and opposed to a portion of the wiring portion 43a of the lower conductor layer 43 with the dielectric film 5 disposed in between. The dielectric film 5 and these portions of the upper conductor layer 75 and the wiring portion 43a form the capacitor 125 of FIG. 6.

A portion of the upper conductor layer 76 is disposed in the opening 6C6 and opposed to another portion of the wiring portion 41a of the lower conductor layer 41 with the dielectric film 5 disposed in between. The dielectric film 5 and these portions of the upper conductor layer 76 and the wiring portion 41a form the capacitor 126 of FIG. 6.

Reference is now made to FIG. 1, FIG. 4 and FIG. 5 to describe the terminal electrodes 11 to 14 in detail. The terminal electrode 11 is disposed to touch part of the side surface 2c of the substrate 2, and part of each of the side surface of the insulating layer 3, the side surface of the dielectric film 5, the side surface of the insulating layer 6 and the side surface of the protection film 8 that are disposed at the side surface 1c of the device main body 1B. Furthermore, the terminal electrode 11 has a concave portion 11c that accommodates and touches at least part of the protruding portion 41p. In such a manner, the terminal electrode 11 is connected to the lower conductor layer 41. The terminal electrode 11 is smaller in width than the side surface 1c.

The terminal electrode 12 is disposed to touch part of the side surface 2d of the substrate 2, and part of each of the side surface of the insulating layer 3, the side surface of the dielectric film 5, the side surface of the insulating layer 6 and the side surface of the protection film 8 that are disposed at the side surface 1d of the device main body 1B. Furthermore, the terminal electrode 12 has a concave portion 12c that accommodates and touches at least part of the protruding portion 43p. In such a manner, the terminal electrode 12 is connected to the lower conductor layer 43. The terminal electrode 12 is smaller in width than the side surface 1d.

The terminal electrode 13 is disposed to touch part of the side surface 2e of the substrate 2, and part of each of the side surface of the insulating layer 3, the side surface of the dielectric film 5, the side surface of the insulating layer 6 and the side surface of the protection film 8 that are disposed at the side surface 1e of the device main body 1B. Furthermore, the terminal electrode 13 has a concave portion that accommodates and touches at least part of the protruding portion 74p. In such a manner, the terminal electrode 13 is connected to the upper conductor layer 74. The terminal electrode 13 is smaller in width than the side surface 1e.

The terminal electrode 14 is disposed to touch part of the side surface 2f of the substrate 2, and part of each of the side surface of the insulating layer 3, the side surface of the dielectric film 5, the side surface of the insulating layer 6 and the side surface of the protection film 8 that are disposed at the side surface 1f of the device main body 1B. Furthermore, the terminal electrode 14 has a concave portion that accommodates and touches at least part of the protruding portion 72p. In such a manner, the terminal electrode 14 is connected to the upper conductor layer 72. The terminal electrode 14 is smaller in width than the side surface 1f.

Reference is now made to FIG. 5 and FIG. 7 to FIG. 13 to describe a method of manufacturing the thin-film device 1 of the embodiment. FIG. 7 to FIG. 13 are cross-sectional views for describing the method of manufacturing the thin-film device 1. FIG. 7 to FIG. 13 show cross sections corresponding to FIG. 5. Although examples of materials and thicknesses of the layers are given in the following description, those examples are non-limiting for the method of the embodiment.

Figure 7:
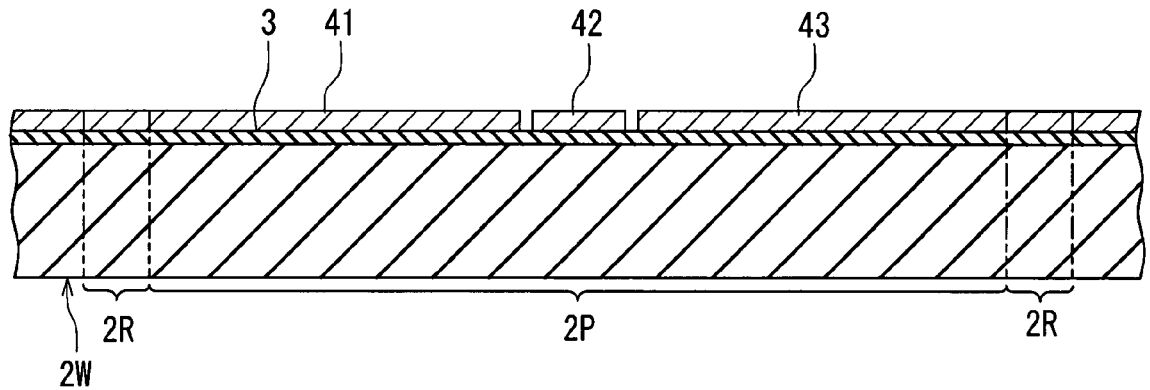
FIG. 7 is a cross-sectional view illustrating a step of a method of manufacturing the thin-film device of the first embodiment of the invention.

FIG. 7 illustrates a step of the method of manufacturing the thin-film device 1. In the step, first, a wafer 2W is prepared. The wafer 2W includes: pre-substrate portions 2P arranged in a plurality of rows; and portions to be removed 2R that are provided between respective adjacent ones of the pre-substrate portions 2P. The pre-substrate portions 2P are portions each of which will be the substrate 2 later. The portions to be removed 2R are portions that will be removed later by cutting the wafer 2W.

Next, the insulating layer 3 is formed on the wafer 2W. Next, the top surface of the insulating layer 3 is flattened by polishing. A method employed for this polishing may be chemical mechanical polishing (CMP), for example. The polishing is performed so that the thickness of the insulating layer 3 polished will be 2 μm, for example. It is not necessary to flatten the top surface of the insulating layer 3 by polishing if the surface roughness of the top surface of the insulating layer 3 is small enough without a flattening process.

Next, the lower conductor layers 41 to 43 are formed on the insulating layer 3. The lower conductor layers 41 and 43 are formed such that every pair of the layers 41 and 43 that are adjacent to each other across a region above the portions to be removed 2R are coupled to each other in that region.

The lower conductor layers 41 to 43 are formed in the following manner, for example. First, an electrode film is formed on the insulating layer 3 by sputtering, for example. The electrode film will be used as an electrode when a plating film is formed later by electroplating, and will form portions of the lower conductor layers 41 to 43. The electrode film may be a layered film made up of a Ti film having a thickness of 30 nm and a Cu film having a thickness of 100 nm, for example. Next, a photoresist layer having a thickness of 8 μm, for example, is formed on the electrode film. Next, the photoresist layer is patterned by photolithography to form a frame. The frame has grooves having shapes corresponding to the lower conductor layers 41 to 43 to be formed. Next, the plating film is formed in the grooves of the frame by electroplating using the electrode film as the electrode. The plating film is made of Cu, for example, and has a thickness of 9 to 10 μm, for example. Next, the top surface of the plating film is flattened by polishing. A method employed for this polishing is CMP, for example. The polishing is performed so that the thickness of the plating film polished will be 8 μm, for example. Next, the frame is removed. Next, the electrode film except a portion below the plating film is removed by dry etching or wet etching. The lower conductor layers 41 to 43 are thereby formed by the remaining portions of the electrode film and the plating film.

Instead of employing such a process, the lower conductor layers 41 to 43 may be formed by forming an unpatterned plating film on the entire top surfaces of the electrode film and then etching portions of this plating film and the electrode film. Alternatively, the lower conductor layers 41 to 43 may be formed by forming an unpatterned conductor film on the insulating layer 3 by physical vapor deposition such as sputtering or evaporation and then etching a portion of the conductor film.

Figure 8:
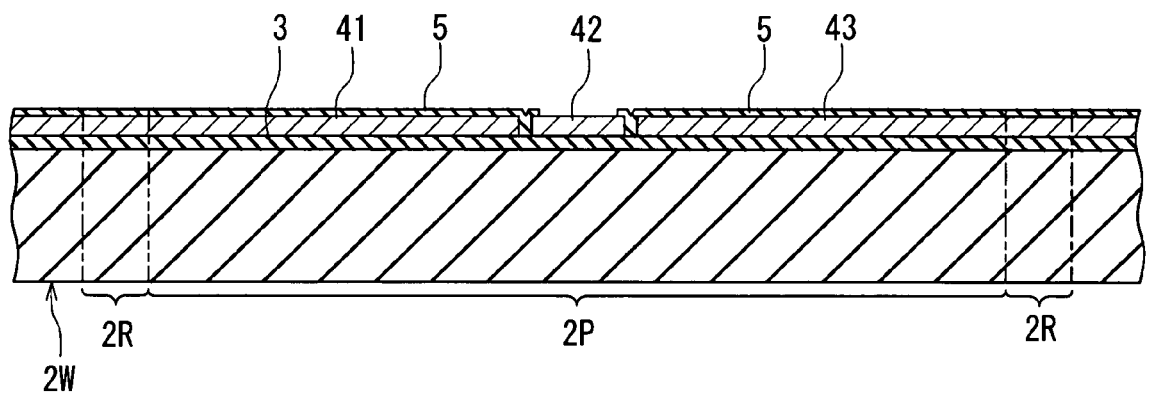
FIG. 8 is a cross-sectional view illustrating a step that follows the step of FIG. 7.

FIG. 8 illustrates the following step. In the step, first, the dielectric film 5 is formed by sputtering, for example, to cover the insulating layer 3 and the lower conductor layers 41 to 43. The dielectric film 5 is formed to have a thickness of 0.1 μm, for example. Next, a photoresist layer is formed on the dielectric film 5. The photoresist layer is then patterned by photolithography to form a plurality of openings in the photoresist layer. The openings are formed at locations corresponding to the openings 55 to 59 to be formed in the dielectric film 5. Next, portions of the dielectric film 5 corresponding to the plurality of openings of the photoresist layer are removed by ashing or etching. The openings 55 to 59 are thereby formed in the dielectric film 5. Next, the photoresist layer is removed.

Figure 9:
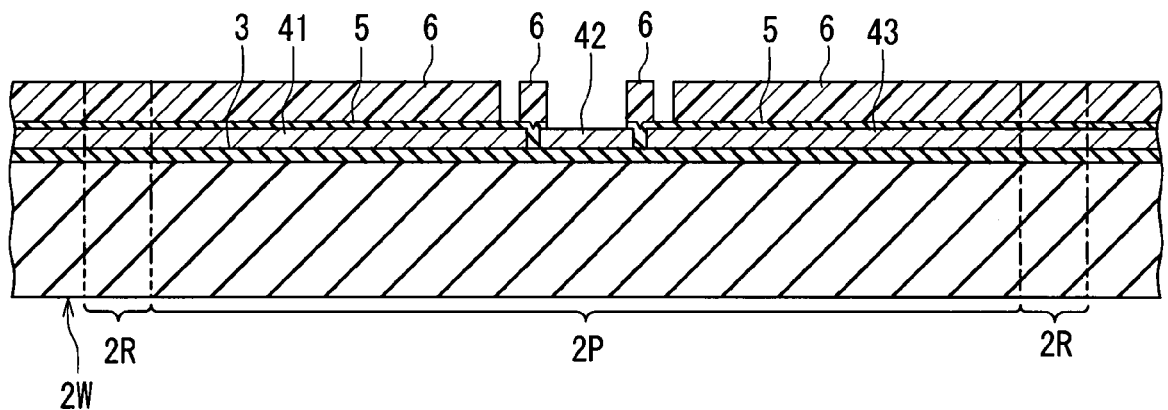
FIG. 9 is a cross-sectional view illustrating a step that follows the step of FIG. 8.

Next, as shown in FIG. 9, the insulating layer 6 is formed on the dielectric film 5. The insulating layer 6 has the openings 65 to 69 and 6C1 to 6C6. If a photosensitive resin is used as the material of the insulating layer 6, the insulating layer 6 is patterned by photolithography. If a material other than a photosensitive resin is used as the material of the insulating layer 6, the insulating layer 6 is patterned by selective etching, for example.

Figure 10:
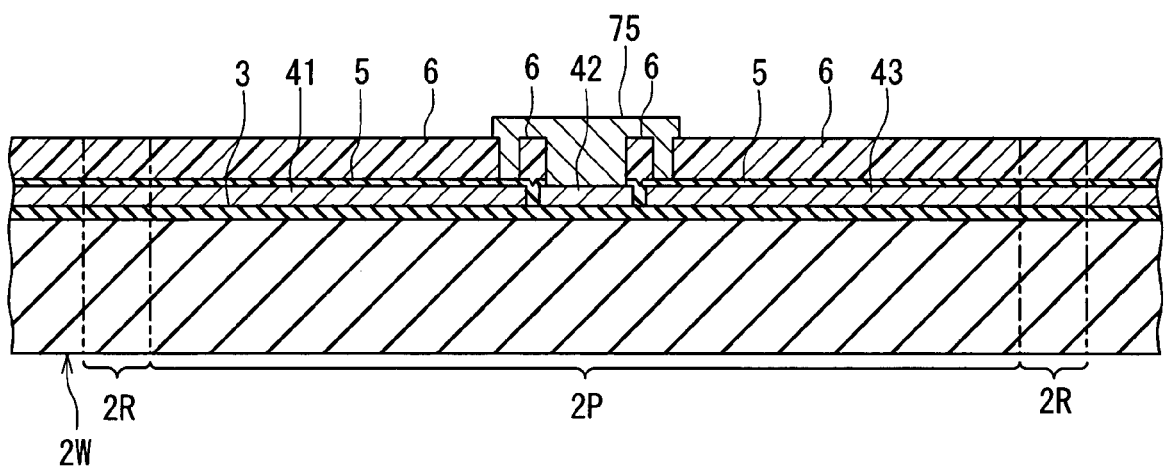
FIG. 10 is a cross-sectional view illustrating a step that follows the step of FIG. 9.

FIG. 10 illustrates the following step. In the step, the upper conductor layers 72 and 74 to 76 are formed. In FIG. 10 the upper conductor layers 72, 74 and 76 do not appear. The upper conductor layers 72 and 74 are formed such that every pair of the layers 72 and 74 that are adjacent to each other across a region above the portions to be removed 2R are coupled to each other in that region. The method of forming the upper conductor layers 72, 74 to 76 is the same as that of the lower conductor layers 41 to 43.

Figure 11:
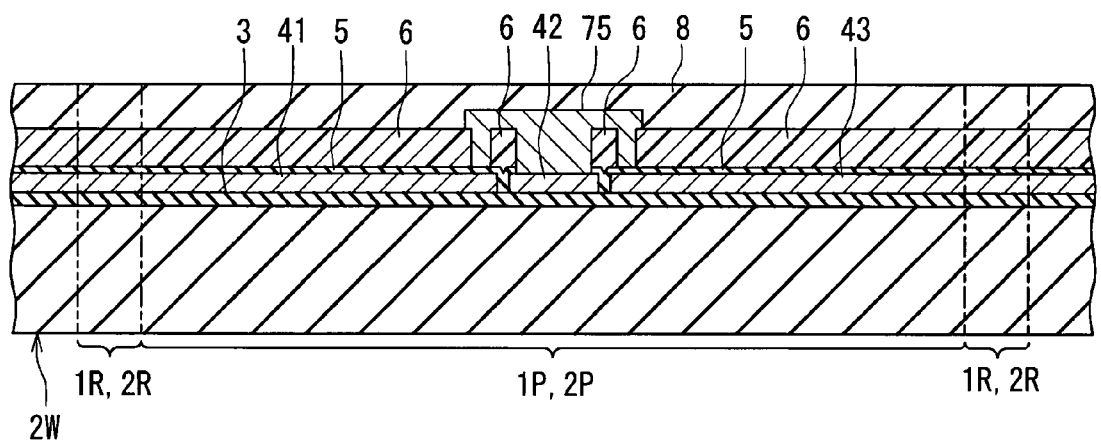
FIG. 11 is a cross-sectional view illustrating a step that follows the step of FIG. 10.

Next, as shown in FIG. 11, the protection film 8 is formed to cover the insulating layer 6 and the upper conductor layers 72, 74 to 76.

Here, the layered structure made up of the layers from the wafer 2W to the protection film 8 fabricated through the foregoing steps is called a thin-film device substructure. The substructure includes: a plurality of preliminary device main body portions 1P that will be the respective device main bodies 1B; and the portions to be removed 1R that are disposed between respective adjacent ones of the preliminary device main body portions 1P. The preliminary device main body portions 1P are made up of the pre-substrate portions 2P and portions thereabove of the substructure. The portions to be removed 1R are made up of the portions to be removed 2R and portions thereabove of the substructure.

Figure 12:
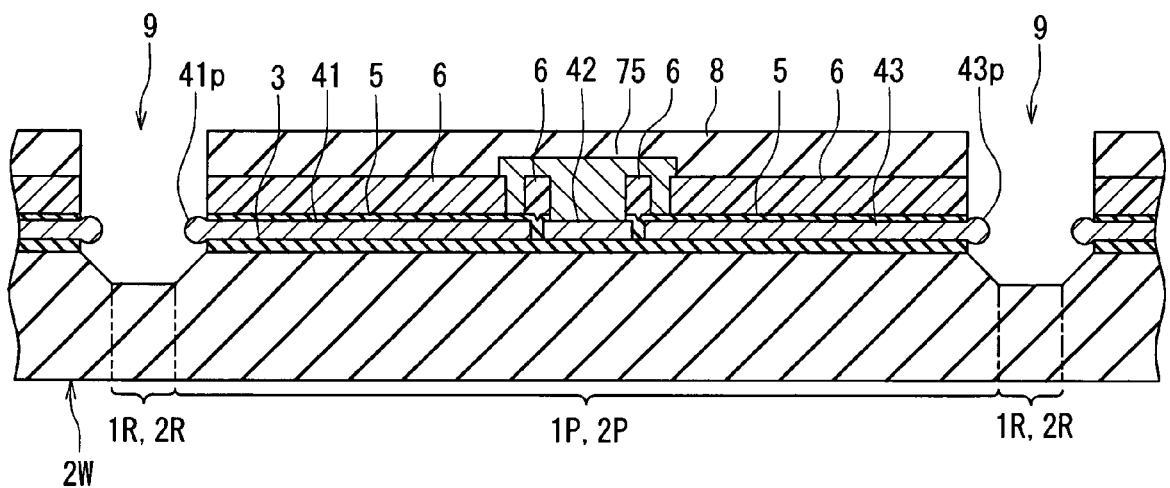
FIG. 12 is a cross-sectional view illustrating a step that follows the step of FIG. 11.

Next, as shown in FIG. 12, shallow recessing is performed on the substructure at the locations of the portions to be removed 1R. In this shallow recessing, portions of the protection film 8, the upper conductor layers 74 and 72, the insulating layer 6, the dielectric film 5, the lower conductor layers 41 and 43, and the insulating layer 3 are removed in a region greater than the width of the portions to be removed 1R, and portions of the wafer 2W above a specific level are removed so as to form a surface of the wafer 2W that will be a sloped surface later. Shallow recesses 9 are thereby formed in the substructure. The shallow recessing may be performed by laser processing, for example. When the shallow recessing is performed, portions of the upper conductor layers 74 and 72 that are coupled to each other in the region above the portions to be removed 2R are ruptured and the cross sections thereof are rounded, so that the protruding portions 74p and 72p having the shapes previously described are formed. Similarly, portions of the lower conductor layers 41 and 43 that are coupled to each other in the region above the portions to be removed 2R are ruptured and the cross sections thereof are rounded, so that the protruding portions 41p and 43p having the shapes previously described are formed.

Figure 13:
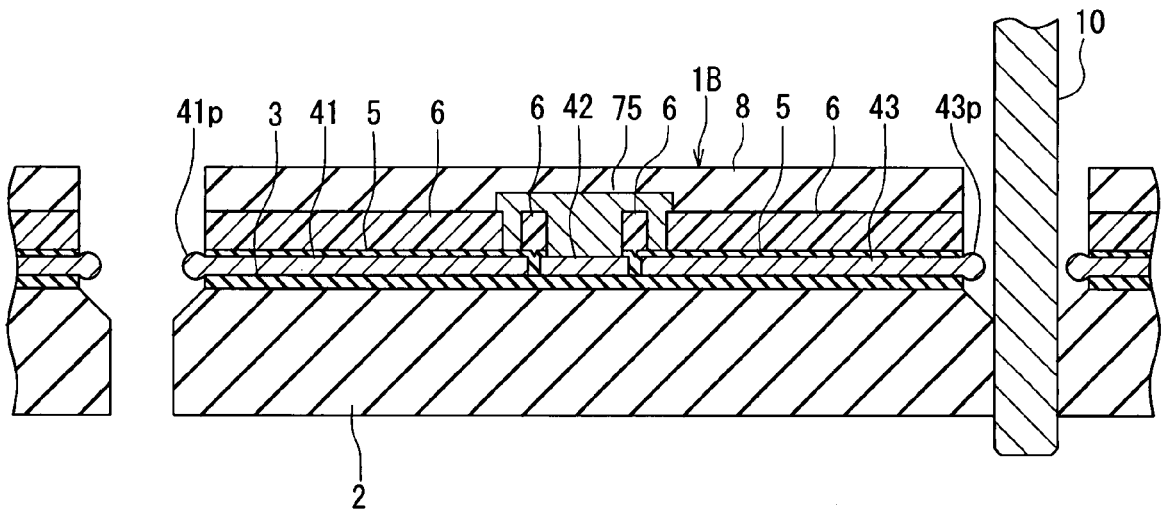
FIG. 13 is a cross-sectional view illustrating a step that follows the step of FIG. 12.

Next, as shown in FIG. 13, the substructure is cut with a dicing saw, for example, at the locations of the portions to be removed 1R. As a result, the portions to be removed 1R of the substructure are removed, and the plurality of preliminary device main body portions 1P are separated. At this time, the side surfaces 2c to 2f of the substrate 2 including sloped surfaces are formed. The preliminary device main body portions 1P separated become the device main bodies 1B. In FIG. 13 numeral 10 indicates the blade of the dicing saw.

Next, as shown in FIG. 5, the terminal electrodes 11 to 14 are formed at specific locations of the device main bodies 1B. The terminal electrodes 11 to 14 are formed in the following manner, for example. First, a base electrode film is formed at a specific location of each of the device main bodies 1B. The base electrode film may be formed by applying a conductive resin or a conductive paste to the specific location of the device main body 1B by screen printing or transfer and then drying and hardening the resin or paste. Alternatively, a base electrode film made of a conductive film may be formed by forming a mask having an opening at a specific location on the device main body 1B, forming a conductive film by sputtering, for example, on the mask and in the opening, and then removing the mask. The conductive film used in this case may be a layered film made up of a Cr film and a Cu film, a layered film made up of a Ti film and a Cu film, or a layered film made up of an Ni film and a Cu film, for example. Next, a plating film is formed on the base electrode film by barrel plating, for example. The plating film may be a layered film made up of a first film of Ni or Ti and a second film of Sn or Au, or a layered film made up of a first film of Cu, a second film of Ni or Ti, and a third film of Sn or Au, for example.

The method of forming the terminal electrodes 11 to 14 is not limited to the above-described method. For example, the terminal electrodes 11 to 14 may be formed by applying a conductive resin or a conductive paste to the specific locations of the device main body 1B by screen printing or transfer and then drying and hardening the resin or paste.

Effects of the thin-film device 1 of the embodiment will now be described. In the thin-film device 1 of the embodiment, the lower conductor layers 41 and 43 respectively incorporate the protruding portions 41p and 43p protruding to extend more outward in a lateral direction than the side surface of the insulating layer 3 and the side surface of the dielectric film 5. The concave portion 11c of the terminal electrode 11 accommodates and touches at least part of the protruding portion 41p, thereby connecting the terminal electrode 11 to the lower conductor layer 41. The concave portion 12c of the terminal electrode 12 accommodates and touches at least part of the protruding portion 43p, thereby connecting the terminal electrode 12 to the lower conductor layer 43. Similarly, the upper conductor layers 74 and 72 respectively incorporate the protruding portions 74p and 72p protruding to extend more outward in a lateral direction than the side surface of the insulating layer 6 and the side surface of the protection film 8. The concave portion of the terminal electrode 13 accommodates and touches at least part of the protruding portion 74p, thereby connecting the terminal electrode 13 to the upper conductor layer 74. The concave portion of the terminal electrode 14 accommodates and touches at least part of the protruding portion 72p, thereby connecting the terminal electrode 14 to the upper conductor layer 72. According to the embodiment, such a configuration makes it possible that the areas of the regions in which the conductor layers 41, 43, 74 and 72 touch the terminal electrodes 11 to 14 are made greater, compared with the case in which the terminal electrodes touch only the end faces of the conductor layers and are thereby connected to the conductor layers. As a result, it is possible to enhance the reliability of connection between the conductor layers 41, 43, 74, 72 and the terminal electrodes 11 to 14.

According to the embodiment, when each of the protruding portions 41p, 43p, 74p and 72p is sectioned with an imaginary plane intersecting the top surface of the underlying layer (the insulating layer 3 or 6) at a right angle, at least part of the contour of the cross section of each of the protruding portions 41p, 43p, 74p and 72p forms a convex-shaped curved line. As a result, according to the embodiment, the contact between the protruding portions 41p, 43p, 74p, 72p and the terminal electrodes 11 to 14 is enhanced and it is thereby possible to further improve the reliability of connection between the conductor layers 41, 43, 74, 72 and the terminal electrodes 11 to 14.

According to the embodiment, the maximum thickness of each of the protruding portions 41p, 43p, 74p and 72p is greater than the thickness of any portion of the conductor layers 41, 43, 74 and 72 other than the protruding portions 41p, 43p, 74p and 72p. As a result, according to the embodiment, it is possible to further increase the areas of the regions in which the conductor layers 41, 43, 74 and 72 touch the terminal electrodes 11 to 14. As a result, it is possible to further enhance the reliability of connection between the conductor layers 41, 43, 74, 72 and the terminal electrodes 11 to 14.

Second Embodiment

A thin-film device of a second embodiment of the invention will now be described. The thin-film device of the second embodiment has a circuit configuration the same as that of the first embodiment.

Figure 14:
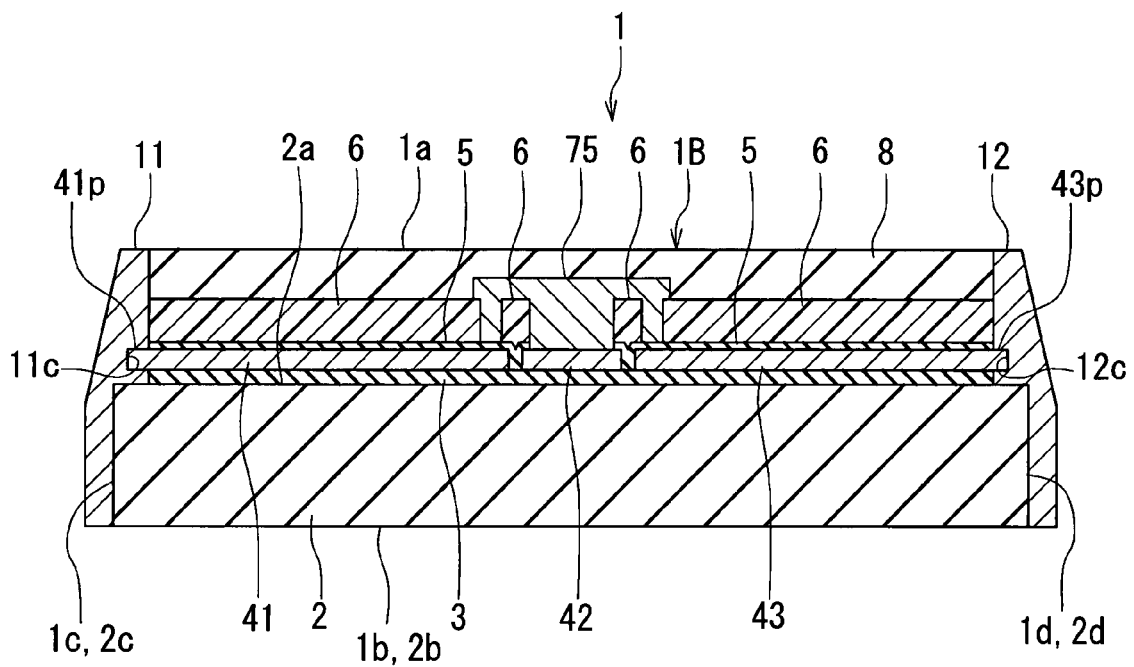
FIG. 14 is a cross-sectional view of a thin-film device of a second embodiment of the invention.

FIG. 14 is a cross-sectional view of the thin-film device of the second embodiment, and shows a cross section corresponding to FIG. 5. In the thin-film device 1 of the second embodiment, the contour of the cross section of each of the protruding portions 41p, 43p, 74p and 72p is rectangular. Furthermore, in the second embodiment, the maximum thickness of each of the protruding portions 41p and 43p is equal to the thickness of any portion of the lower conductor layers 41 and 43 other than the protruding portions 41p and 43p. In addition, the maximum thickness of each of the protruding portions 74p and 72p is equal to the thickness of any portion of the upper conductor layers 74 and 72 other than the protruding portions 74p and 72p. In the second embodiment the substrate 2 is rectangular-solid-shaped. The remainder of configuration of the thin-film device 1 of the second embodiment is the same as that of the first embodiment.

Figure 15:
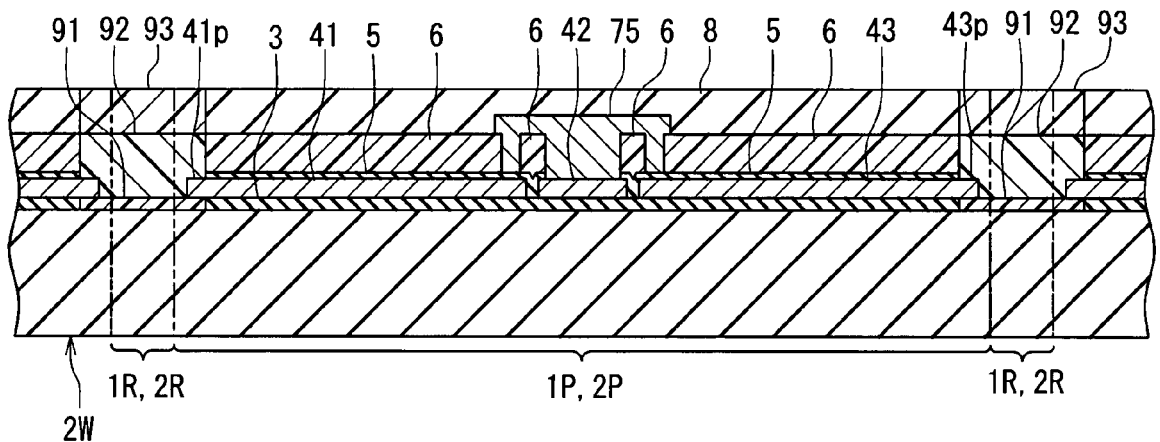
FIG. 15 is a cross-sectional view illustrating a step of a method of manufacturing the thin-film device of the second embodiment of the invention.
Figure 16:
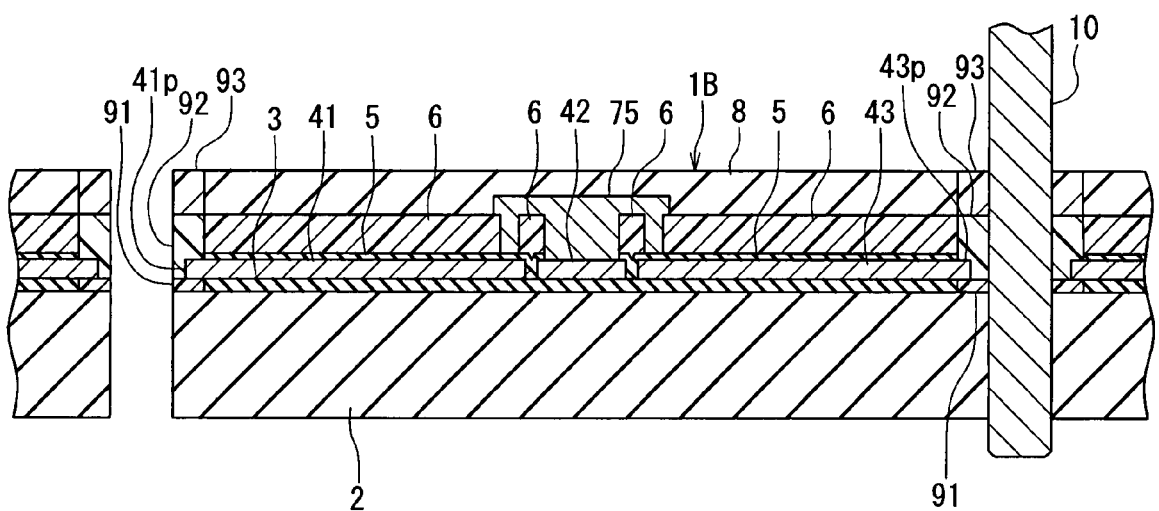
FIG. 16 is a cross-sectional view illustrating a step that follows the step of FIG. 15.

Reference is now made to FIG. 15 and FIG. 16 to describe a method of manufacturing the thin-film device 1 of the second embodiment. FIG. 15 and FIG. 16 are cross-sectional views for describing the method of manufacturing the thin-film device 1 of the second embodiment. FIG. 15 and FIG. 16 show cross sections corresponding to FIG. 14. Although examples of materials and thicknesses of the layers are given in the following description, those examples are non-limiting for the method of the embodiment.

FIG. 15 illustrates a step of the method of manufacturing the thin-film device 1. In the step, first, the insulating layer 3 and a photoresist layer 91 are formed on the wafer 2W. In the second embodiment the insulating layer 3 is patterned in advance to have a final shape in the thin-film device 1. The photoresist layer 91 is disposed on a region of the top surface of the wafer 2W where the insulating layer 3 is not disposed. This region is slightly greater than the width of the portions to be removed 2R. Either of the insulating layer 3 and the photoresist layer 91 may be formed first. For example, the insulating layer 3 may be first formed on the entire top surface of the wafer 2W, and the photoresist layer 91 may be formed after patterning the insulating layer 3. Alternatively, the photoresist layer 91 patterned by photolithography may be first formed, and then the insulating layer 3 patterned may be formed using the photoresist layer 91 as a mask. Next, the top surfaces of the insulating layer 3 and the photoresist layer 91 are flattened by polishing. The thickness of each of the insulating layer 3 and the photoresist layer 91 polished is 2 μm, for example. It is not necessary to flatten the top surfaces of the insulating layer 3 and the photoresist layer 91 by polishing if the surface roughness of the top surface of each of the insulating layer 3 and the photoresist layer 91 is small enough without a flattening process.

Next, the lower conductor layers 41 to 43 are formed on the insulating layer 3 and the photoresist layer 91. The lower conductor layers 41 to 43 are formed through the method the same as that of the first embodiment. In the second embodiment the lower conductor layers 41 and 43 are patterned such that the protruding portions 41p and 43p are formed in advance. Alternatively, the lower conductor layers 41 and 43 may be formed to extend over regions above the portions to be removed 2R, so that the protruding portions 41p and 43p are formed later when the wafer 2W is cut.

Next, the dielectric film 5 is formed by sputtering, for example, to cover the insulating layer 3 and the lower conductor layers 41 to 43. The dielectric film 5 is formed to have a thickness of 0.1 μm, for example. Next, the openings 55 to 59 are formed in the dielectric film 5 in a manner the same as that of the first embodiment. At this time, in the second embodiment, the dielectric film 5 is patterned in advance to have a final shape in the thin-film device 1.

Next, the insulating layer 6 is formed on the dielectric film 5 in a manner the same as that of the first embodiment. The insulating layer 6 has the openings 65 to 69 and 6C1 to 6C6. In the second embodiment, the insulating layer 6 is patterned in advance to have a final shape in the thin-film device 1.

Next, in a region above the photoresist layer 91, a photoresist layer 92 is formed on the photoresist layer 91 and portions of the lower conductor layers 41 and 43.

Next, the upper conductor layers 72 and 74 to 76 are formed on the insulating layer 6 and the photoresist layer 92. The method of forming the upper conductor layers 72 and 74 to 76 is the same as that of the first embodiment. In the second embodiment the upper conductor layers 74 and 72 are patterned such that the protruding portions 74p and 72p are formed in advance. Alternatively, the upper conductor layers 74 and 72 may be formed to extend over regions above the portions to be removed 2R, so that the protruding portions 74p and 72p are formed later when the wafer 2W is cut. In FIG. 15 the upper conductor layers 72, 74 and 76 do not appear. Next, the protection film 8 is formed to cover the insulating layer 6 and the upper conductor layers 72 and 74 to 76, and a photoresist layer 93 is formed on the photoresist layer 92 and portions of the upper conductor layers 74 and 72 in a region above the photoresist layer 91. In the second embodiment, the protection film 8 is patterned in advance to have a final shape in the thin-film device 1. Either of the protection film 8 and the photoresist layer 93 may be formed first. For example, the protection film 8 patterned may be formed first, and then the photoresist layer 93 may be formed. Alternatively, the photoresist layer 93 patterned by photolithography may be formed first, and then the protection film 8 patterned may be formed using the photoresist layer 93 as a mask.

Next, as shown in FIG. 16, the substructure is cut at the locations of the portions to be removed 1R. As a result, the plurality of preliminary device main body portions 1P are separated. The preliminary device main body portions 1P separated become the device main bodies 1B. At this point, the photoresist layers 91 to 93 remain in the device main bodies 1B. In FIG. 16 numeral 10 indicates the blade of a dicing saw.

Next, the photoresist layers 91 to 93 are removed from the device main bodies 1B by ashing or etching or by using a solvent. As a result, the protruding portions 41p, 43p, 74p and 72p of the conductor layers 41, 43, 74 and 72 are exposed. The terminal electrodes 11 to 14 are then formed, as shown in FIG. 14.

In the step shown in FIG. 16, after the substructure is cut at the locations of the portions to be removed 1R, the photoresist layers 91 to 93 are removed. Instead of employing such a method, the photoresist layers 91 to 93 may be removed before the substructure is cut at the locations of the portions to be removed 1R. In the second embodiment it is not necessarily required to form the photoresist layer 93.

The remainder of functions and effects of the second embodiment are the same as those of the first embodiment except those resulting from the shapes of the protruding portions 41p, 43p, 74p and 72p of the first embodiment.

The present invention is not limited to the foregoing embodiments but may be practiced in still other ways. For example, the thin-film device of the invention may include a semiconductor layer or a magnetic layer in addition to the conductor layers. Furthermore, the number of terminal electrodes of the thin-film device of the invention is not limited to four but may be any number. The terminal electrodes of the thin-film device of the invention may touch not only part of the side surfaces of the device main body but also part of the top or bottom surface of the device main body contiguous to the side surfaces.

The invention is applicable not only to thin-film devices having the function of a band-pass filter disclosed in the embodiments but also to thin-film devices in general incorporating conductor layers and terminal electrodes connected to the conductor layers. Functions of thin-film devices to which the invention is applied include those of passive elements such as a capacitor and an inductor, active elements such as a transistor, and circuits including a plurality of elements. Specifically, such circuits include an LC circuit component, various sorts of filters such as a low-pass filter, a high-pass filter and a band-pass filter, a diplexer, and a duplexer.

The thin-film device of the invention is utilized for a mobile communications apparatus such as a cellular phone and a communications apparatus for a wireless local area network (LAN).

Obviously many modifications and variations of the present invention are possible in the light of the above teachings. It is therefore to be understood that within the scope of the appended claims the invention may be practiced otherwise than as specifically described.

What is claimed is:

1. A thin-film device comprising:

an underlying layer having a bottom surface and a top surface that face toward opposite directions, and a side surface that couple the bottom surface and the top surface to each other;

a conductor layer disposed on the top surface of the underlying layer; and a terminal electrode connected to the conductor layer; and a coating layer having a bottom surface and a top surface that face toward opposite directions, and a side surface that couples the bottom surface and the top surface to each other, wherein:

the conductor layer has a protruding portion that protrudes to extend more outward in a lateral direction than the side surface of the underlying layer and the side surface of the coating layer;

at least a portion of the conductor layer other than the protruding portion is disposed between the top surface of the underlying layer and the bottom surface of the coating layer; and the terminal electrode has a concave portion that accommodates and touches at least part of the protruding portion, and the terminal electrode touches the side surface of the underlying layer and the side surface of the coating layer.

2. The thin-film device according to claim 1, wherein the underlying layer is made of an insulating material.

3. The thin-film device according to claim 1, wherein the coating layer is made of an insulating material.

4. The thin-film device according to claim 1, wherein, when the protruding portion is sectioned with an imaginary plane intersecting the top surface of the underlying layer at a right angle, at least part of a contour of a cross section of the protruding section forms a convex-shaped curved line.

5. The thin-film device according to claim 1, wherein a maximum thickness of the protruding portion is greater than a thickness of any portion of the conductor layer other than the protruding portion.

* * * * *